US012682980B2

(12) United States Patent
McCombs, Jr. et al.

(10) Patent No.: US 12,682,980 B2
(45) Date of Patent: Jul. 14, 2026

(54) SELF-REPAIR MEMORY TECHNIQUES

(71) Applicant: Arm Limited, Cambridge (GB)

(72) Inventors: Edward Martin McCombs, Jr., Austin, TX (US); Cyrille Nicolas Dray, Antibes (FR); Nicolaas Klarinus Johannes Van Winkelhoff, Roquefort-les-pins (FR)

(73) Assignee: Arm Limited, Cambridge (GB)

( * ) Notice: Subject to any disclaimer, the term of this patent is extended or adjusted under 35 U.S.C. 154(b) by 39 days.

(21) Appl. No.: 17/870,457

(22) Filed: Jul. 21, 2022

(65) Prior Publication Data

US 2024/0029813 A1     Jan. 25, 2024

(51) Int. Cl.
*G11C 29/44*          (2006.01)
*G11C 29/12*          (2006.01)

(52) U.S. Cl.
CPC .... *G11C 29/4401* (2013.01); *G11C 29/12005* (2013.01)

(58) Field of Classification Search
CPC ...................... G11C 29/4401; G11C 29/12005
USPC ......................................................... 714/718
See application file for complete search history.

(56) References Cited

U.S. PATENT DOCUMENTS 6,976,198 B1 *  12/2005  Vaida ................. G01R 31/3187
                                                                714/41
7,260,758 B1 *   8/2007  Agrawal ................ G11C 29/56
                                                                714/733

8,132,131 B2 *   3/2012  Barth, Jr. ............... G11C 29/72
                                                                716/101
10,490,296 B2 * 11/2019  Ouellette ............... G11C 29/44
2009/0303813 A1 * 12/2009  Fekih-Romdhane ........................
                                                                G11C 29/789
                                                                365/185.08
2013/0227344 A1 *  8/2013  Sohn ......................... G11C 8/10
                                                                714/6.21
2014/0029362 A1 *  1/2014  Adham .................. G11C 17/16
                                                                365/200
2014/0281686 A1 *  9/2014  Ware ................... G06F 11/2094
                                                                714/6.12
2017/0309349 A1 * 10/2017  Mondal .................. G11C 29/38
2019/0042480 A1 *  2/2019  Khatib Zadeh ........ G11C 29/44
2022/0113889 A1 *  4/2022  Park ..................... G11C 29/022

OTHER PUBLICATIONS

Mayuga, et al.; Highly Reliable Memory Architecture Using Adaptive Combination of Proactive Aging-Aware In-Field Self-Repair and ECC; IEEE Transactions on Computer-Aided Design of Integrated Circuits and Systems; vol. 39, Iss. 8; Aug. 2020.
Su, et al.; An Integrated ECC and Redundancy Repair Scheme for Memory Reliability Enhancement; 20th IEEE International Symposium on Defect and Fault Tolerance in VLSI Systems (DFT'05); Oct. 2005.

* cited by examiner

*Primary Examiner* — James C Kerveros
(74) *Attorney, Agent, or Firm* — Pramudji Law Group PLLC; Ari Pramudji

(57) ABSTRACT

Various implementations described herein are directed to a method that tests and repairs memory fabricated on a wafer or a package. The method may generate and store a reuse table based on memory repair results. The method may manufacture the memory after repairing the memory. The method may access and reuse data stored in the reuse table to repair the memory after manufacturing the memory.

20 Claims, 4 Drawing Sheets

100

Self-Repair Memory Technique 104

Wafer Fabrication 110

20 repairs
108 unused
repairs

MBIST/Repair 120 → Reuse Table 124
(Generated by MBIST)

System Test 130

Production 140

22 repairs
106 unused
repairs 21 repairs
107 unused
repairs

Reuse Table 124
(Reused after Production)

100

Self-Repair Memory Technique 104

300

Reuse Table 304

| Fuse Register 314 | Pass/Fail Status 318 | Memory ID 324 | Availability Status 328 |
|---|---|---|---|
| 0x00000002 | pass | 0001 | available |
| 0x00000040 | fail | 0001 | not available |
| . . . . . | . . . . . | . . . . . | . . . . . |
| 0x00000701 | pass | 1000 | available |

410 — Detect Memory Failure
(ECC or Parity Detection)

420 — Locate Memory ID and
Point to Safe Row for Repair

430 — Update Repair Chain with New Memory ID

440 — Update Memory Status as Ready for Use

SELF-REPAIR MEMORY TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Conventional memory built-in self testing (MBIST) may be used to repair some errors pre-production and before operational use. However, conventional MBIST logic is deficient because MBIST logic only provides an initial testing of memory and only repairs pre-production errors before operational use of the memory in a device. Also, the MBIST logic surrounding memories are used to determine which bitcells to repair and the repair algorithm is deployed. Unfortunately, conventional MBIST methodologies that are used to test memories are typically inefficient because many unused bits are never used over the life of the memory, wherein unused bits are simply ignored for the life of the part, and as the device matures, bitcells continue to fail due to end of life or process variation. Thus, over time, other bitcells can fail due to end of life aspects of the device, and as such, there exists a need to improve memory repair techniques so as to effectively extend the useful life of the device post-production and after operational use of the memory.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIG. 3 illustrates a diagram of a reuse table for reuse in a self-repair memory technique in accordance with various implementations described herein.

DETAILED DESCRIPTION

Various implementations described herein refer to and are directed to various self-repair memory schemes and techniques for various memory applications. In some applications, the various self-repair memory schemes and techniques may include self-healing system cache memories using test logic and data stored in a reuse table, wherein the various self-repair memory schemes and techniques described herein are configured to reuse the reuse table so as to self-heal or self-repair the memory during idle cycles after manufacturing the memory and after operational use of the memory. Further, the various self-repair memory schemes and techniques provide for post-production testing and repair after manufacturing and operating the memory includes reusing the data stored in the reuse table to self-repair the memory during idle cycles of post-production operation after manufacturing the memory and after putting (or placing) the memory in operational use so as to effectively extend useful life of a device having the memory.

Various implementations of memory testing circuitry for memory applications will now be described in greater detail herein with reference to FIGS. 1-4.

Figure 1:
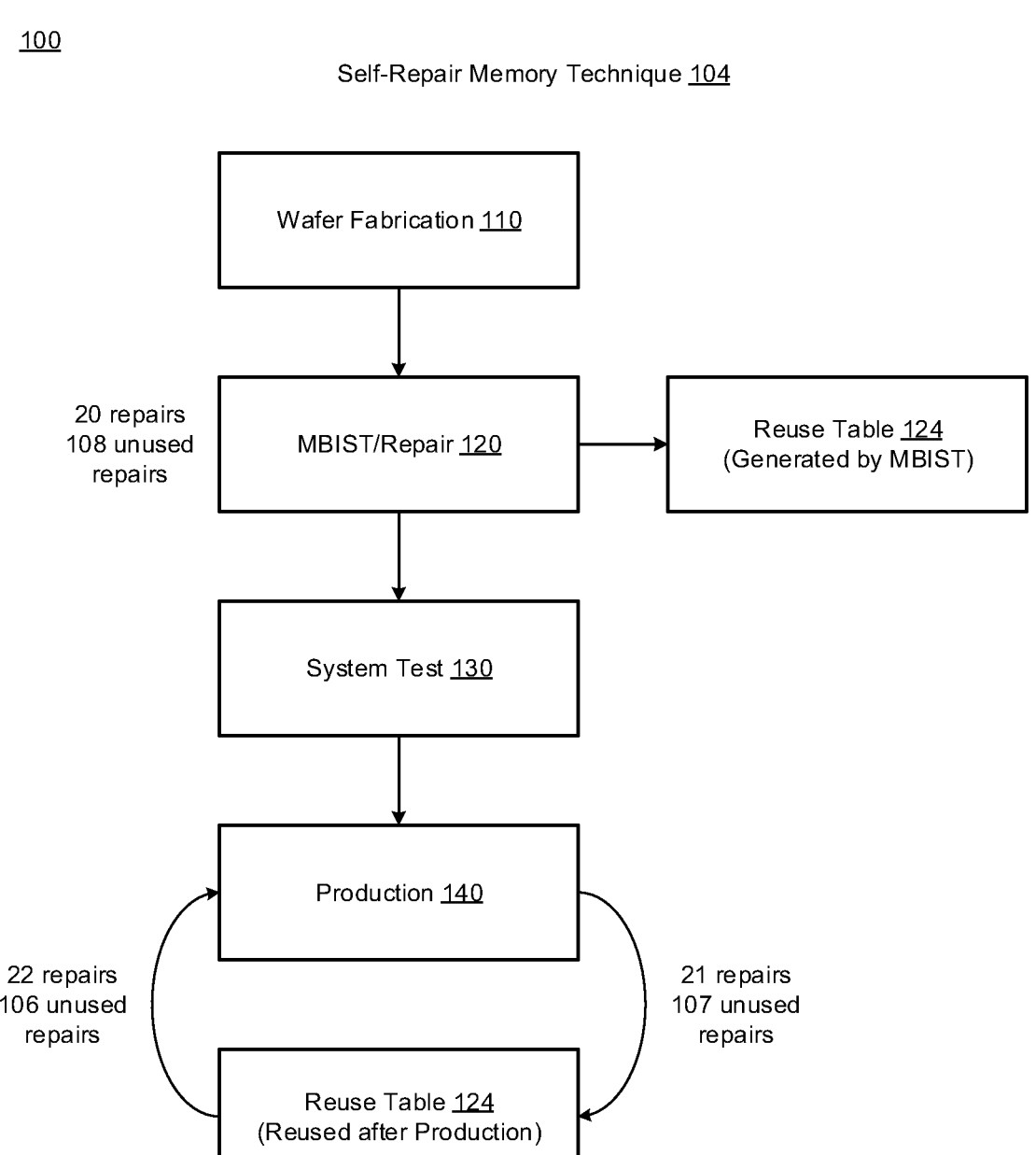
FIG. 1 illustrates a diagram of a method using a self-repair memory technique in accordance with various implementations described herein.

FIG. 1 illustrates a process diagram 100 of a method 104 using a self-repair memory technique in accordance with various implementations described herein.

It should be understood that even though method 104 may indicate a particular order of operation execution, in some instances, various portions of the operations may be executed in a different order, and on different systems. In other instances, additional operations and/or steps may be added to and/or omitted from method 104. Also, method 104 may be implemented in hardware and/or software. If implemented in hardware, the method 104 may be implemented with various circuit components as described herein in reference to FIGS. 2-3. If implemented in software, method 104 may be implemented as a program or a software instruction process that may be configured for memory testing as described herein. Moreover, if implemented in software, various instructions related to implementing method 104 may be stored in memory and/or a database. For instance, a computer or various other types of computing devices having a processor and memory and/or a database may be configured to perform method 104.

As described and shown in reference to FIG. 1, method 104 may be utilized for testing and repairing memory in accordance with various self-repair memory schemes and techniques described herein. For instance, as described herein, method 104 may be utilized for improving post-production memory testing and self-repair after manufacturing the memory and/or after placing the memory in operational use so as to effectively extend the useful life of a device having the memory.

At block 110, method 104 may perform wafer fabrication by fabricating memory on a wafer or a package. In various applications, the memory may include cache memory that is configured to operate as self-repair cache memory.

At block 120, method 104 may perform MBIST based testing and repair of the memory that is fabricated on the wafer or the package, wherein MBIST refers to memory built-in self-testing. In some applications, method 104 may test and repair the memory by performing initial testing and repair using memory MBIST. Also, at block 120, method 104 may generate and store a reuse table 124 based on memory repair results, and the reuse table 120 may be generated during MBIST based testing and repair. For instance, method 120 may perform 20 memory repairs, and there may be 108 unused memory repairs that remain available for other repairs. Also, testing the memory may identify errors in memory locations of the memory, and repairing the memory may repair errors in memory locations of the memory. Also, the data stored in the reuse table includes the memory repair results, and memory repair results include one or more addresses that point to repaired memory locations of the memory. In various applications, the reuse table is stored in fuse memory formed on the wafer or the package, or the reuse table is stored in registers as part of a non-volatile memory that is different than the memory.

At block 130, method 104 may perform a system test 140 of the memory so as to ensure that the memory is functioning properly after initial testing and repair. Also, at block 140, method 104 may perform production operations for manufacturing the memory after previously repairing the memory. Also, at block 140, after production of the memory, method 104 may perform post-production testing and repair of the memory, wherein method 104 may access and reuse data stored in the reuse table 124, which is reused after production, so as to repair the memory after manufacturing the memory.

In some implementations, after manufacturing the memory, and after putting (or placing) the memory in operational use, method 104 may perform another memory repair (e.g., for a total of 20+1=21 memory repairs) in a first post-production repair cycle, and there may be 107 unused memory repairs that remain available for other repairs. Further, method 120 may then perform another memory repair (e.g., for a total of 21+1=22 memory repairs) in a second post-production repair cycle, and there may be 108 unused memory repairs that remain available for other repairs. In various applications, this additional post-production repair cycle may be repeated any number of times so as to make any number of additional repairs in the memory during future usage so as to thereby effectively extend the useful life of a device having the memory.

In some implementations, method 104 may perform post-production testing and repair after manufacturing and operating the memory, which may include accessing and reusing the data stored in the reuse table so as to repair the memory after the memory is put (or placed) into service. Also, method 104 may perform post-production testing and repair after manufacturing and operating the memory, which may include reusing the data stored in the reuse table to self-repair the memory during idle cycles of post-production operation after manufacturing the memory so as to effectively extend useful life of a device having the memory. Moreover, after repairing the memory by reusing a reuse table entry in the reuse table, method 104 may then mark the reuse table entry as invalid such that a subsequent repair in post-production uses a different reuse table entry in the reuse table for the subsequent repair after the memory is put (or placed) into service.

Figure 2:
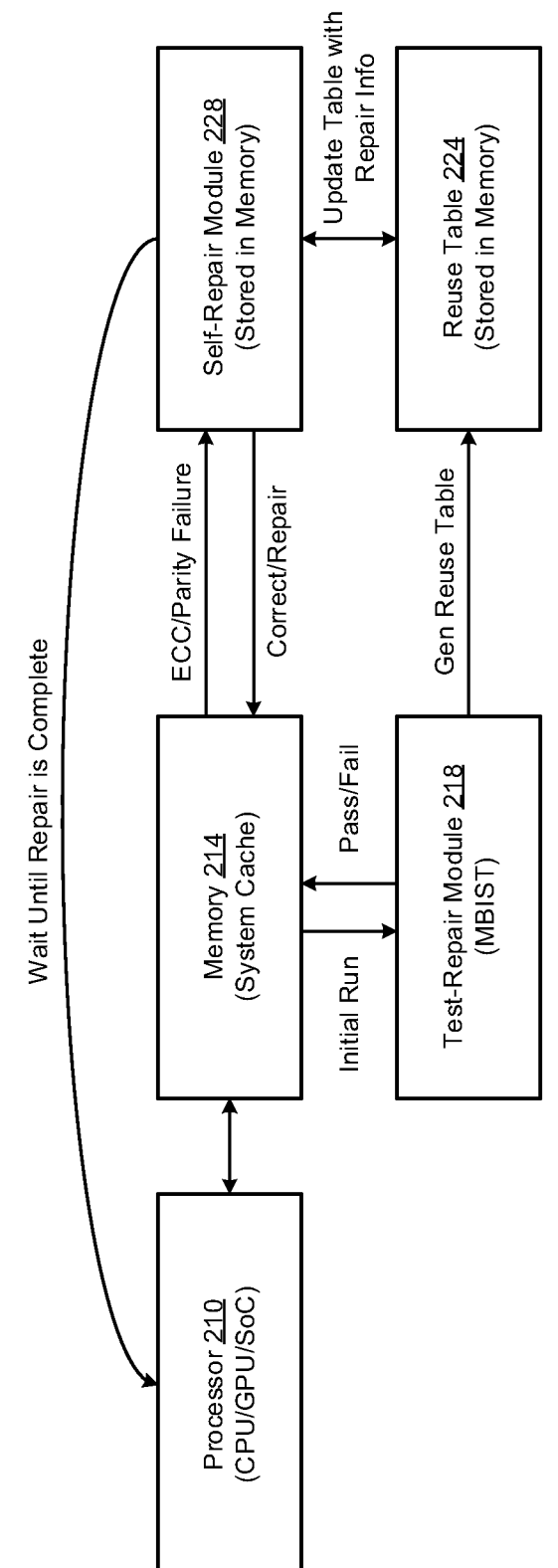
FIG. 2 illustrates a diagram of self-repair memory architecture in accordance with various implementations described herein.

FIG. 2 illustrates a schematic diagram 200 of self-repair memory architecture 204 in accordance with various implementations described herein.

In various implementations, the self-repair memory architecture 204 may be implemented as a system or device having various integrated circuit (IC) components that are arranged and coupled together as an assemblage or combination of parts that provide for physical circuit designs and various related structures. In some instances, a method of designing, providing, building and/or fabricating the self-repair memory architecture 204 as an integrated system or some type of device may use of various IC circuit components described herein so as to thereby implement various self-repair schemes and techniques associated therewith. Further, the self-repair memory architecture 204 may be integrated with various computing circuitry and related components on a single chip, and also, the self-repair memory architecture 204 may be implemented in various embedded systems for automotive, electronic, mobile, server and Internet-of-things (IoT) applications.

As shown in reference to FIG. 2, the self-repair memory architecture 204 may have various circuitry including, e.g., a processor 210, a memory 214, a test-repair module 218, a reuse table 224 and a self-repair module 228. In some applications, the processor 210 may interface with and utilize the memory 214 after repairing and manufacturing the memory 214. Also, the memory 214 may be fabricated and formed on a semiconductor wafer or package, and the memory 214 may include a system cache that is arranged as an array of bitcells, such as, e.g., an array of static random access memory (SRAM), or a similar type of memory. Also, the test-repair module 218 may be configured to test and repair the memory 214 that is fabricated on the wafer, and the test-repair module 218 may generate (gen) and store the reuse table 224 based on memory repair results. Also, the self-repair module 228 may access and reuse data stored in the reuse table 224 to thereby repair the memory 214 after manufacturing the memory 214.

In various implementations, the test-repair module 218 may interface with the memory 214 so as to test the memory 214 by identifying various types of data errors in memory locations of the memory 214, and also, the test-repair module 218 may use MBIST to initially repair the memory 214 by repairing data errors in the memory locations of the memory 214. In some applications, data stored in the reuse table 224 may include the memory repair results, and also, the memory repair results may include one or more addresses that point to repaired memory locations of the memory 214. In some instances, the reuse table 224 may be stored in fuse memory formed on the wafer, or the reuse table 224 may be stored in registers as part of a non-volatile memory that is fabricated on the wafer that is different than the memory 214 that has failed.

In some applications, the self-repair module 228 may perform post-production test-repair after manufacturing and/or operating the memory 214 that includes accessing and reusing the data stored in the reuse table 224 so as to repair the memory after using the memory 214 for a predetermined period of time, such as, e.g., the amount of time a device having the memory 214 has been put (or placed) into service. Moreover, in various applications, post-production testing and repair after manufacturing and/or operating the memory 214 may include reusing the data stored in the reuse table 224 to self-repair the memory 214 during idle cycles of post-production operation in a time after manufacturing the memory so as to effectively extend useful life of a device having the memory.

In various implementations, the memory 214 may include cache memory that may be configured to operate as self-repair cache memory. Also, the test-repair module 218 may tests and repair the memory 214 by performing an initial testing and repair using memory built-in self-test (MBIST). However, as described herein in great detail, the various self-repair memory schemes and techniques may be used for improving post-production memory testing and self-repair after manufacturing the memory 214 and/or after putting (or placing) the memory 214 in operational use so as to effectively extend the useful life of a device having the memory 214.

In some operational applications, the self-repair memory architecture 204 may use the processor 210 as a centralized processing unit (CPU, a graphics processing unit (GPU), and/or system-on-a chip (SoC). The processor 210 may be configured to interface and communicate with the memory 214, and the processor may use the memory 214 as a system cache memory, such e.g., L1/L2 cache memory. Also, the memory 214 may be configured to interface and communicate with the test and repair module 218, wherein an initial run may be performed pre-production and before operational use, and wherein the test and repair module 218 may be configured to provide pass/fail memory test/repair results that may be stored in the reuse table 224.

Also, as described herein, the test and repair module 218 may be configured to generate (gen) the reuse table 224, which is stored in memory that is different than the system cache memory 214. Also, the self-repair module 228 may be stored in memory and configured to interface and communicate with the memory 214 correct and/or repair memory that has failed, wherein data is corrupt and unusable. Also, the self-repair module 228 may interface and communicate with the memory 214 so as to receive data and information related to ECC/parity failures in the memory 214, which may be corrected and/or repaired by the self-repair module 228. Also, the self-repair module 228 may interface and communicate with the reuse table 224 so as to update and modify the reuse table 224 with post-production repair data and information.

In various implementations, each bitcell in the memory 214 may be referred to as a memory cell, and each bitcell may be configured to store at least one data bit value (e.g., data value associated with logical '0' or '1'). Each row of bitcells in the memory 214 may include any number of bitcells or memory cells arranged in various configurations, such as, e.g., a two-dimensional (2D) memory array having columns and rows of multiple bitcells arranged in a 2D grid pattern with 2D indexing capabilities. Also, each bitcell may be implemented with random access memory (RAM), or some other type of volatile type of memory. For instance, each bitcell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit. Also, in other instances, each memory cell may be implemented with an embedded magneto-resistive RAM (eMRAM) cell, or some other type of non-volatile memory cell that provides for similar features, behaviors and/or characteristics.

Generally, there are multiple types of memory structures: one-wordline devices (i.e., single port) and multi-wordline devices (i.e., multi-port memory, such as, e.g., dual port memory). One-wordline devices (e.g., ROM, RAM, DRAM, SRAM, etc.) may refer to devices having only one access port, which may be referred to as access devices. The bitlines may utilize single or dual rail architecture. The transistor types (e.g., N-type MOS and P-type MOS) may be referred to as access transistors. In various applications, high-density SRAM bitcells that are implemented with minimally sized transistors may limit Vmin of a design. However, in FinFET technology, device sizing quantization remains a challenge for compact 6T SRAM bitcells with minimum-size transistors. As such, in some applications, careful optimization of design memory assist circuits may be used to deliver low power memory operation. Further, each bitcell in the memory 214 may be accessed with a wordline WL and complementary bitlines BL, NBL.

Generally, static RAM bitcells may include 6T bitcells, which may have access ports controlled by wordlines (WLs). In some other cases, static RAM bitcells may be implemented with a 5T bitcell, 4T 2R bitcell, or various other types of CMOS SRAM cells, such as, e.g., 8T, 10T or more transistors per bit. Further, multi-wordlines may result in multiple access ports into each of the bitcells. Since there are multiple access ports, the multi-ports access devices may be varied within each bitcell so that some access devices (by port) are NFETs and some access devices by port are PFETs. Although these may be effectively varied within each single bitcell, their number of ports may not be easily divided into equal capacitance and/or power. Thus, although these multi-ports transistor types may vary within each bitcell, there may also be a need to have a variation between arrays as in a left half array and a right half array.

In some implementations, other RAM bitcells may include eMRAM cells. Unlike conventional RAM cells, such as, e.g., SRAM, data in eMRAM is stored using magnetic storage elements, instead of using an electric charge or current. The magnetic elements may be formed with two ferromagnetic plates separated by a thin insulating layer, wherein one plates has a set polarity with a permanent magnet and the other plate is selectively magnetized to show a resistive differential across the plates. This configuration is known as a magnetic tunnel junction and forms the structure for an MRAM cell. To store data, when the two plates have the same magnetization alignment (low resistance state), this may be translated as a logical 1 state and when the magnetization alignment is not the same (high resistance state), this may be translated as a logical 0 state.

The self-repair memory architecture 204 including each bitcell in the memory 214 may be implemented as an integrated circuit (IC) with various types of memory, such as, e.g., random access memory (RAM), and/or any other types of memory, including any type of volatile memory and non-volatile memory. The self-repair memory architecture 204 may be implemented as an IC with single and/or dual rail memory architectures. Also, the self-repair memory architecture 204 may be integrated with computing circuitry and/or related components on a single chip. Moreover, the self-repair memory architecture 204 may be implemented in various embedded systems for automotive, electronic, mobile, server and Internet-of-things (IoT) applications, including remate sensor nodes FIG. 3 illustrates a diagram 300 of a reuse table 304 for reuse in a self-repair memory technique in accordance with various implementations described herein.

As shown in FIG. 3, the reuse table 304 may have various components, such as, e.g., a fuse register 314, a pass/fail status 318, a memory ID 324 and an availability status 328. For instance, the fuse register 314 may provide memory address locations (e.g., 0x00000002, 0x00000040, . . . , 0x00000701) for bitcells that are useable (pass) or unusable (fail). Also, the memory address locations have corresponding pass/fail status indicators 318, and the memory address locations have corresponding memory IDs 324 (e.g., 0001, 0001, . . . , 1000). Also, the memory address locations have corresponding availability status indicators 328 (e.g., available or not available).

In some implementations, the reuse table 304 may be a set of register files or a simple fused memory, wherein the fused memory may already exist, a non-volatile RAM may be added to support and store data in the reuse table 304. Also, the reuse table 304 may be configured to support various types of memory on the chip, wafer or package. In addition, the reuse table 304 may be configured to store from any number of entries, such as, e.g., 1 to N entries. Also, the reuse table 304 may only store safe lines.

Figure 4:
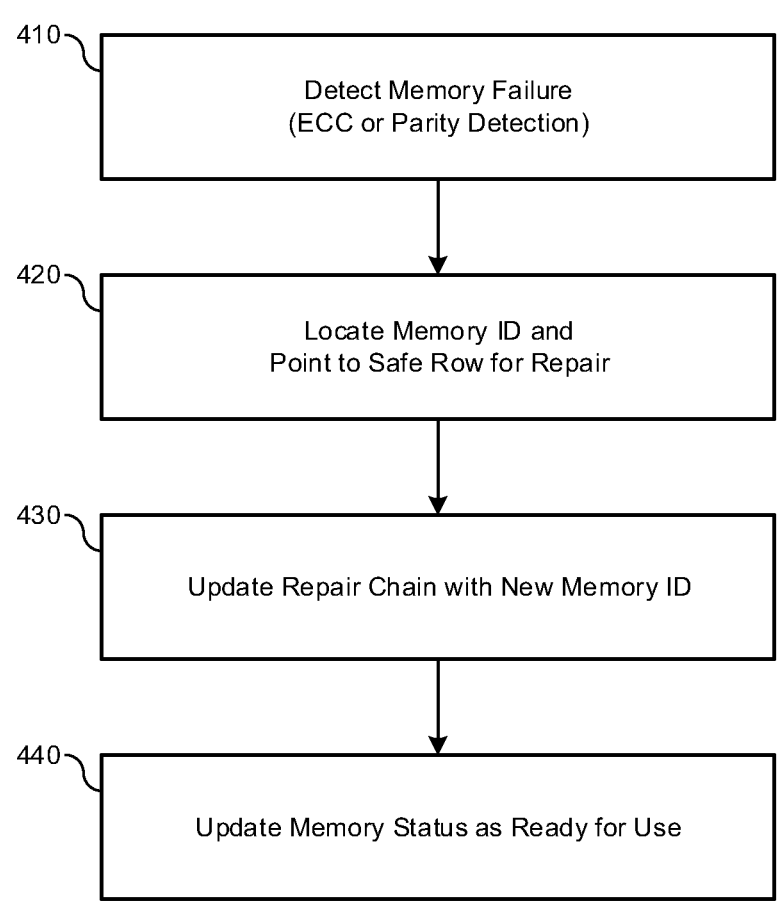
FIG. 4 illustrates a diagram of a method using a self-repair memory technique in accordance with various implementations described herein.

FIG. 4 illustrates a process diagram of a method 400 for a self-repair memory technique in accordance with various implementations described herein.

It should be understood that even though method 400 may indicate a particular order of operation execution, in some instances, various portions of the operations may be executed in a different order, and on different systems. In other instances, additional operations and/or steps may be added to and/or omitted from method 400. Also, method 400 may be implemented in hardware and/or software. If implemented in hardware, the method 400 may be implemented with various circuit components as described herein in reference to FIGS. 2-3. If implemented in software, method 400 may be implemented as a program or a software instruction process that may be configured for memory testing as described herein. Moreover, if implemented in software, various instructions related to implementing method 400 may be stored in memory and/or a database. For instance, a computer or various other types of computing devices having a processor and memory and/or a database may be configured to perform method 400.

As described and shown in reference to FIG. 4, method 400 may be utilized for testing and repairing memory in accordance with various self-repair memory schemes and techniques described herein. For instance, as described herein, method 104 may be utilized for improving post-production memory testing and self-repair after manufacturing the memory and/or after placing the memory in operational use so as to effectively extend the useful life of a device having the memory.

In some implementations, at block 410, method 400 may detect memory failure in memory after manufacturing the memory. Also, at block 420, method 400 may locate memory identification of the memory and pointing to a row in the memory for repair. Also, at block 430, method 400 may update a repair chain in a reuse table with the memory identification that points to the row in the memory for repair. In addition, at block 440, method 400 may update memory status of the memory as ready for use.

In some implementations, method 400 may test and repair the memory after detecting memory failure, and method 400 may generate and store the reuse table based on memory repair results. Also, testing the memory includes identifying errors in memory locations of the memory after detecting memory failure, and further, repairing the memory includes repairing the errors in the memory locations of the memory.

Also, in some implementations, method 400 may manufacture the memory after repairing the memory; and method 400 may access and reuse data stored in the reuse table so as to repair the memory after manufacturing the memory. Also, method 400 may perform post-production testing and repair after manufacturing and operating the memory that includes accessing and reusing data stored in the reuse table to repair the memory after the memory is put into service. Also, the reuse table may be stored in fuse memory, or the reuse table may be stored in registers as part of non-volatile memory that is different than the memory, which may be formed on a wafer or a package.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a method that tests and repairs memory fabricated on a wafer or a package. The method may generate and store a reuse table based on memory repair results. The method may manufacture the memory after repairing the memory. The method may access and reuse data stored in the reuse table to repair the memory after manufacturing the memory.

Described herein are various implementations of a device having a test-repair module that tests-repairs memory fabricated on a wafer and generates-stores a reuse table based on memory repair results. The device may have a processor that interfaces-uses the memory after repairing and manufacturing the memory. The device may have a self-repair module that access-reuses data stored in the reuse table to thereby repair the memory after manufacturing the memory.

Described herein are various implementations of a method that detects memory failure in memory after manufacturing the memory. The method may locate memory identification of the memory and pointing to a row in the memory for repair. The method may update a repair chain in a reuse table with the memory identification that points to the row in the memory for repair. The method may update memory status of the memory as ready for use.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon or In response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, comprising:

performing an initial testing and repair of memory fabricated on a wafer or a package, comprising:

testing the memory, comprising identifying one or more errors in the memory, wherein a first subset of the one or more errors is associated with one or more first memory locations of the memory, and wherein a second subset of the one or more errors is associated with one or more second memory locations of the memory; and repairing the memory based on the one or more errors, comprising repairing the first subset of the one or more errors associated with the one or more first memory locations;

generating and storing a reuse table based on memory repair results corresponding to the initial testing and repair, comprising storing the reuse table in a second memory formed on the wafer or the package on which the memory is fabricated, wherein data stored in the reuse table comprises:

data indicating that the one or more first memory locations have been repaired; and data indicating that the one or more second memory locations have not been repaired;

manufacturing the memory after performing the initial testing and repair; and performing a post-production testing and repair of the memory after manufacturing the memory, comprising:

accessing the data stored in the reuse table after manufacturing the memory; and repairing the memory based on the accessed data stored in the reuse table, comprising repairing the second subset of the one or more errors associated with the one or more second memory locations.

2. The method of claim 1, wherein:

the data stored in the reuse table corresponds to the memory repair results; and the data indicating that the one or more second memory locations have not been repaired includes data corresponding to one or more addresses that point to the one or more second memory locations.

3. The method of claim 1, wherein generating and storing the reuse table comprises:

storing the reuse table in fuse memory formed on the wafer or the package; or storing the reuse table in registers as part of a non-volatile memory that is different than the memory.

4. The method of claim 1, wherein accessing the data stored in the reuse table comprises accessing and reusing the data stored in the reuse table to repair the memory after the memory is put into service.

5. The method of claim 1, wherein repairing the second subset of the one or more errors comprises:

self-repairing the memory during idle cycles of post-production operation after manufacturing the memory by reusing a reuse table entry in the reuse table, wherein the reuse table entry corresponds to a respective second memory location; and after self-repairing the memory by reusing the reuse table entry in the reuse table, marking the reuse table entry as invalid such that a different reuse table entry in the reuse table is used for a subsequent repair.

6. The method of claim 5, wherein marking the reuse table entry as invalid comprises updating the availability status of the reuse table entry from available to not available.

7. The method of claim 1, wherein:

the memory comprises cache memory that is configured to operate as self-repair cache memory; and performing the initial testing and repair of the memory further comprises performing the initial testing and repair using memory built-in self-testing (MBIST).

8. The method of claim 1, wherein the data indicating that the one or more second memory locations have not been repaired comprises availability status data indicating that the one or more second memory locations are available for use in repairing the memory after manufacturing.

9. The method of claim 1, wherein repairing the memory based on the accessed data stored in the reuse table comprises selecting, prior to repairing the memory after manufacturing, at least one of the one or more second memory locations based on the data indicating that the one or more second memory locations have not been repaired.

10. A device, comprising:

a test-repair module configured to:

perform an initial testing and repair of memory fabricated on a wafer or a package, comprising:

test the memory, comprising identify one or more errors in the memory, wherein a first subset of the one or more errors is associated with one or more first memory locations of the memory, and wherein a second subset of the one or more errors is associated with one or more second memory locations of the memory; and repair the memory based on the one or more errors, comprising repair the first subset of the one or more errors associated with the one or more first memory locations; and generate and store a reuse table based on memory repair results corresponding to the initial testing and repair, comprising store the reuse table in a second memory formed on the wafer or the package on which the memory is fabricated, wherein data stored in the reuse table comprises:

data indicating that the one or more first memory locations have been repaired; and data indicating that the one or more second memory locations have not been repaired;

a processor configured to interface with the memory after the test-repair module performs the initial testing and repair and after manufacturing of the memory; and a self-repair module configured to:

perform post-production testing and repair of the memory after the manufacturing of the memory, comprising:

access the data stored in the reuse table after manufacturing the memory; and repair the memory based on the accessed data stored in the reuse table, comprising repair the second subset of the one or more errors associated with the one or more second memory locations.

11. The device of claim 10, wherein:

the data stored in the reuse table corresponds to the memory repair results; and the data indicating that the one or more second memory locations have not been repaired includes data corresponding to one or more addresses that point to the one or more second memory locations.

12. The device of claim 10, wherein generate and store the reuse table comprises:

store the reuse table in fuse memory formed on the wafer or the package; or store the reuse table in registers as part of a non-volatile memory that is different than the memory.

13. The device of claim 10, wherein access the data stored in the reuse table comprises access and reuse the data stored in the reuse table so as to repair the memory after using the memory for a predetermined period of time.

14. The device of claim 10, wherein repair the second subset of the one or more errors comprises:

self-repair the memory during idle cycles of post-production operation after the manufacturing of the memory by reusing a reuse table entry in the reuse table, wherein the reuse table entry corresponds to a respective second memory location.

15. The device of claim 10, wherein:

the memory comprises a cache memory that is configured to operate as self-repair cache memory; and perform the initial testing and repair of the memory further comprises perform the initial testing and repair using memory built-in self-testing (MBIST).

16. A method, comprising:

detecting a memory failure in memory after manufacturing the memory; and performing a post-production testing and repair of the memory after detecting the memory failure, comprising:

testing the memory, comprising identifying one or more errors associated with one or more memory locations of the memory after detecting the memory failure;

repairing the memory based on the one or more errors, comprising repairing at least a first subset of the one or more errors associated with at least a first subset of the one or more memory locations; and accessing data stored in a reuse table corresponding to memory repair results after manufacturing the memory, wherein the reuse table is stored in a second memory formed on a wafer or a package on which the memory is fabricated, and wherein accessing the data comprises:

updating the data stored in the reuse table to include data corresponding to one or more addresses that point to the one or more memory locations; and updating the data stored in the reuse table to indicate that at least the first subset of the one or more memory locations has been repaired.

17. The method of claim 16, wherein performing the post-production testing and repair further comprises generating and storing the reuse table based on the detected memory failure.

18. The method of claim 17, wherein generating and storing the reuse table comprises storing the reuse table in the second memory, wherein the second memory comprises:

fuse memory; or a non-volatile memory that is different than the memory.

19. The method of claim 16, wherein repairing the memory further comprises repairing the memory after manufacturing the memory.

20. The method of claim 16, wherein repairing the memory further comprises repairing the memory after the memory is put into service.

* * * * *